US011817860B2

(12) United States Patent
Gu

(10) Patent No.: US 11,817,860 B2
(45) Date of Patent: Nov. 14, 2023

(54) DUAL-CLOCK GENERATION CIRCUIT AND METHOD AND ELECTRONIC DEVICE

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/647,885

(22) Filed: Jan. 13, 2022

(65) Prior Publication Data

US 2023/0021203 A1 Jan. 19, 2023

Related U.S. Application Data

(63) Continuation of application No. PCT/CN2021/120130, filed on Sep. 24, 2021.

(30) Foreign Application Priority Data

Jul. 14, 2021 (CN) .......................... 202110794828.9

(51) Int. Cl.
*H03K 3/35* (2006.01)
*H03K 3/356* (2006.01)
*H03M 1/12* (2006.01)
*G06F 1/08* (2006.01)

(52) U.S. Cl.
CPC ......... *H03K 3/356026* (2013.01); *G06F 1/08* (2013.01); *H03M 1/121* (2013.01); *H03M 1/1255* (2013.01)

(58) Field of Classification Search
None
See application file for complete search history.

(56) References Cited

U.S. PATENT DOCUMENTS 5,047,659 A * 9/1991 Ullrich ................ H03K 5/1515
327/295
2007/0247205 A1 10/2007 Kim
2010/0271100 A1* 10/2010 Le ............................ G05F 1/46
327/269

FOREIGN PATENT DOCUMENTS

| CN | 105048998 B | 7/2018 |
|----|-------------|--------|
| CN | 108768396 A | 11/2018 |
| JP | H0851347 A | 2/1996 |
| WO | 2016199522 A | 12/2016 |

OTHER PUBLICATIONS

International Search Report cited in PCT/CN2021/120130 dated Feb. 24, 2022, 9 pages.

* cited by examiner

*Primary Examiner* — Daniel C Puentes
(74) *Attorney, Agent, or Firm* — Cooper Legal Group, LLC

(57) ABSTRACT

The present disclosure relates to a dual-clock generation circuit and method and an electronic device, and relates to the technical field of integrated circuits. The dual-clock generation circuit includes: a first inverter module, configured to access a first signal and output a first clock output signal; a second inverter module, configured to access a second signal and output a second clock output signal, where the first signal and the second signal are opposite clock signals; a first feedforward buffer, disposed between an input terminal of the first inverter module and an output terminal of the second inverter module, and configured to transmit the first signal to compensate for the second clock output signal.

10 Claims, 4 Drawing Sheets

US 11,817,860 B2

DUAL-CLOCK GENERATION CIRCUIT AND METHOD AND ELECTRONIC DEVICE

CROSS-REFERENCE TO RELATED APPLICATIONS

This is a continuation of International Application No. PCT/CN2021/120130, filed on Sep. 24, 2021, which claims the priority to Chinese Patent Application No. 202110794828.9, titled "DUAL-CLOCK GENERATION CIRCUIT AND METHOD AND ELECTRONIC DEVICE" and filed with the China National Intellectual Property Administration (CNIPA) on Jul. 14, 2021. The entire contents of International Application No. PCT/CN2021/120130 and Chinese Patent Application No. 202110794828.9 are incorporated herein by reference.

TECHNICAL FIELD

The present disclosure relates to, but is not limited to, a dual-clock generation circuit and method and an electronic device.

BACKGROUND

As sampling rate metrics continue to increase, the number of analog-to-digital converters (ADCs) in a system is also increasing.

For a time-interleaved sampling system consisting of two ADCs, theoretically it is required that sampling clocks of the two ADCs need to be exactly 180 degrees out of phase.

However, due to delay of a clock generation circuit or temperature process deviation and other effects, as an input signal frequency increases, the sampling clocks of the two ADCs have a phase mismatch, and it is difficult to achieve a phase difference of 180 degrees, greatly affecting system performance.

It should be noted that information disclosed in the above background section is used merely for a better understanding of the background of the present disclosure, and therefore may include information that does not constitute the prior art known to those of ordinary skill in the art.

SUMMARY

An overview of the subject matter detailed in the present disclosure is provided below, which is not intended to limit the protection scope of the claims.

According to a first aspect of the present disclosure, a dual-clock generation circuit is provided, including:

a first inverter module, configured to access a first signal and output a first clock output signal;

a second inverter module, configured to access a second signal and output a second clock output signal, where the first signal and the second signal are opposite clock signals;

a first feedforward buffer, disposed between an input terminal of the first inverter module and an output terminal of the second inverter module, and configured to transmit the first signal to compensate for the second clock output signal; and a second feedforward buffer, disposed between an input terminal of the second inverter module and an output terminal of the first inverter module, and configured to transmit the second signal to delay the first clock output signal.

According to a second aspect of the present disclosure, a method of generating a dual-clock is provided, the method is applied to a dual-clock generation circuit, the dual-clock generation circuit includes a first inverter module configured to access a first signal, a second inverter module configured to access a second signal, a first feedforward buffer, and a second feedforward buffer, and the method includes:

disposing the first feedforward buffer between an input terminal of the first inverter module and an output terminal of the second inverter module, for transmitting the first signal, to compensate for a second clock output signal output by the second inverter module; and disposing the second feedforward buffer between an input terminal of the second inverter module and an output terminal of the first inverter module, for transmitting the second signal, to delay a first clock output signal output by the first inverter module.

According to a third aspect of the present disclosure, an electronic device is provided, including the dual-clock generation circuit described above.

It should be understood that the above general description and the following detailed description are only exemplary and explanatory, and should not be construed as a limitation to the present disclosure.

BRIEF DESCRIPTION OF THE DRAWINGS

The accompanying drawings herein incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

When a plurality of ADCs are integrated in a same chip, due to the mismatch of device parameters between different chip regions, various mismatches occur in synchronization clocks between the plurality of ADCs. The mismatches include: imbalance mismatch, gain mismatch, and phase mismatch of a sampling clock.

Dynamic performance metrics of a sampling system using a plurality of ADCs is often limited by the various mismatches described above. Imbalance mismatch and gain mismatch generally may be alleviated by using external references and other means, while for phase mismatch, phase adjustment needs to be performed on the sampling clocks. The precision of the adjustment is usually affected by a time difference of an initial clock signal. Consequently, as the frequency increases, an effect of alleviating the phase mismatch gradually weakens, and the problem of phase mismatch becomes more serious.

Figure 1:
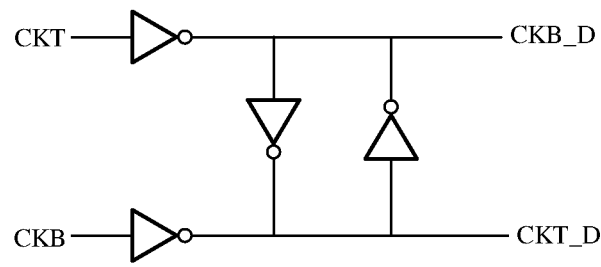
FIG. 1 schematically illustrates a schematic structural diagram of a dual-clock generation circuit of phase mismatch calibration according to an exemplary implementation of the present disclosure.

Referring to FIG. 1, a dual-clock generation circuit of phase mismatch calibration is provided. For the dual-clock generation circuit, two signals such as CKT and CKB in FIG. 1 usually need to be input during signal transmission. Theoretically, a phase difference between the two clocks is 180 degrees. However, due to the various reasons mentioned above, there is a time difference α between the two signals CKT and CKB actually input into the dual-clock generation circuit in FIG. 1, as shown in FIG. 2.

Figure 2:
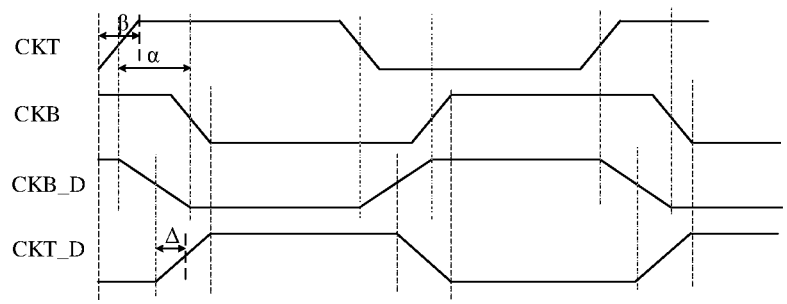
FIG. 2 schematically illustrates a schematic diagram of signal waveforms corresponding to the dual-clock generation circuit shown in FIG. 1.

After the foregoing two signals CKT and CKB pass through the dual-clock generation circuit shown in FIG. 1, two output signals CKB_D and CKT_D shown in FIG. 1 and FIG. 2 are obtained. As can be obtained through calculation from a signal waveform diagram shown in FIG. 2, there is a time difference of $\Delta=(\alpha+\beta)/4$ between the two output signals CKB_D and CKT_D, where β is a time required for CKT to rise or a time required for CKB to fall. In other words, after the signals CKT and CKB with the phase mismatch a are improved by using the dual-clock generation circuit shown in FIG. 1, there may be a phase mismatch of $(\alpha+\beta)/4$ between the two output signals CKB_D and CKT_D.

As can be learned from the result described above, the phase mismatch of $(\alpha+\beta)/4$ is still related to the phase mismatch a of the input signals. In this case, when a sampling frequency increases, an effect of improving phase mismatch calibration by the dual-clock generation circuit provided in FIG. 1 gradually weakens, and the problem of phase mismatch becomes more serious.

Figure 3:
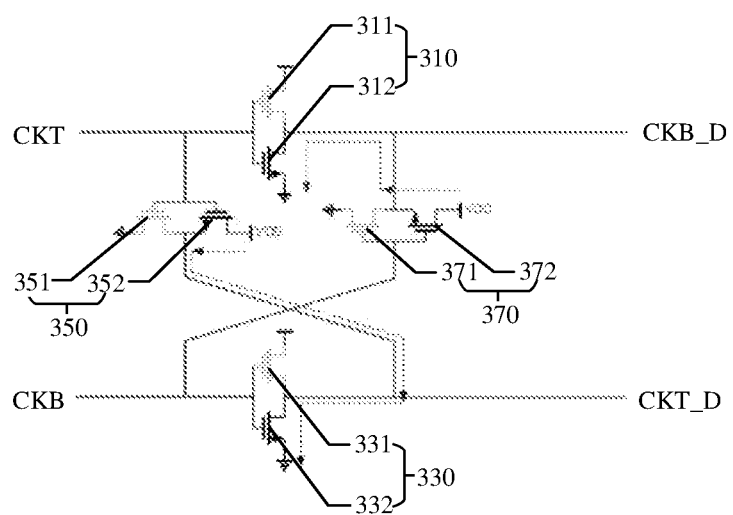
FIG. 3 schematically illustrates a schematic structural diagram of another dual-clock generation circuit of phase mismatch calibration according to an exemplary implementation of the present disclosure.

Therefore, after further study, referring to FIG. 3, the inventor of the present application proposes another dual-clock generation circuit of phase mismatch calibration, and an output edge time difference calibrated by the dual-clock generation circuit is no longer related to the time difference a of the initial clock signals. Therefore, an impact of a frequency on phase mismatch is weakened, which provides a basis for further improvement of the phase mismatch.

The dual-clock generation circuit provided above can be used not only in an ADC but also in any circuit that performs dual-clock transmission, for example, in dual-clock signal transmission between a dynamic random access memory (DRAM) control unit and a DRAM.

As shown in FIG. 3, the dual-clock generation circuit includes a first inverter module 310, a second inverter module 330, a first feedforward buffer 350, and a second feedforward buffer 370.

The first inverter module 310 is configured to access a first signal and output a first clock output signal. The second inverter module 330 is configured to access a second signal opposite to the first signal and output a second clock output signal. For contrast with FIG. 1, in FIG. 3, the first signal is marked as a clock signal CKT, the second signal is marked as a clock signal CKB, the first clock output signal is marked as CKB_D, and the second clock output signal is marked as CKT_D. Theoretically, there is a phase difference of 180 degrees between the first signal and the second signal.

In an exemplary implementation of the present disclosure, the first feedforward buffer 350 is disposed between an input terminal of the first inverter module 310 and an output terminal of the second inverter module 330, and configured to transmit the first signal CKT to compensate for the second clock output signal CKT_D; and the second feedforward buffer 370 is disposed between an input terminal of the second inverter module 330 and an output terminal of the first inverter module 310, and configured to transmit the second signal CKB, to delay the first clock output signal CKB_D.

Figure 4:
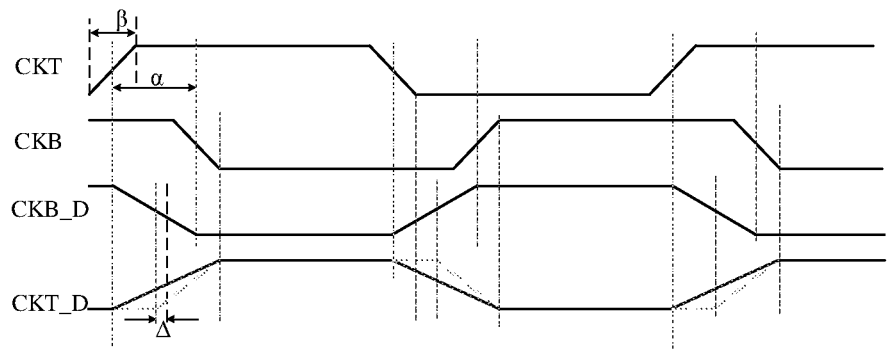
FIG. 4 schematically illustrates a schematic diagram of signal waveforms corresponding to the dual-clock generation circuit shown in FIG. 3.

Using a rising edge of the first signal CKT as an example, in the dual-clock generation circuit provided in this exemplary implementation of the present disclosure, the first feedforward buffer 350 is disposed between the input terminal of the first inverter module 310 and the output terminal of the second inverter module 330, such that the first signal CKT can be transmitted to the output terminal of the second inverter module 330 through the first feedforward buffer 350, to use the first signal CKT to compensate for the second clock output signal CKT_D, to advance a start point of a rising edge of the second clock output signal CKT_D, as shown in FIG. 4. In addition, the second feedforward buffer 370 is disposed between the input terminal of the second inverter module 330 and the output terminal of the first inverter module 310, such that the second signal CKB can be transmitted to the output terminal of the first inverter module 310 through the second feedforward buffer 370, to delay the arrival of an end point of a falling edge of the first clock output signal CKB_D through the second signal CKB. After the start point of the rising edge of the second clock output signal CKT_D is advanced and the end point of the falling edge of the first clock output signal CKB_D is delayed, the phase difference between the two clock output signals CKB_D and CKT_D can be reduced, thereby reducing phase mismatch between generated dual-clock signals.

When the time difference between the initial clock signals CKT and CKB is α and duration of the rising edge of CKT is β, as can be obtained through calculation from the waveform diagram shown in FIG. 4, the first signal and the second signal pass through the dual-clock generation circuit provided in FIG. 3 in this exemplary implementation of the present disclosure, a time difference Δ between output edges of the two output signals CKB_D and CKT_D changes to β/4.

As can be learned from the result described above, the phase mismatch of β/4 is no longer related to the phase mismatch a of the input signals, and naturally is not affected by the initial mismatch phase. In addition, the improvement of the phase mismatch calibration by the dual-clock generation circuit provided in FIG. 3 is also naturally not affected by the frequency, and an improvement effect thereof can also be further improved by improving a rise or fall time β of each of the initial clock signals, thereby providing a possibility of phase mismatch elimination.

In an exemplary implementation of the present disclosure, the first feedforward buffer 350 and the second feedforward buffer 370 may include metal-oxide-semiconductor field-effect transistors (MOS transistors). In addition, types of the MOS transistors constituting the first feedforward buffer 350 and the second feedforward buffer 370 differ depending on whether the rising edge or the falling edge of the input signal needs to be processed.

The first feedforward buffer 350 and the second feedforward buffer 370 shown in FIG. 3 can improve both the rising edge of the input signal and the falling edge of the input signal. FIG. 3 and FIG. 4 respectively show a circuit diagram for improving the rising edge of the input signal CKT, that is, the first signal, and a waveform diagram thereof.

In FIG. 3, the first feedforward buffer 350 and the second feedforward buffer 370 each are a complementary metal-oxide-semiconductor (CMOS) transistor including an NMOS transistor and a PMOS transistor, that is, each are a MOS transistor including an N-type MOS transistor and a P-type MOS transistor. In the process of improving the rising edge of the input first signal CKT, as can be learned from FIG. 4, due to the presence of the initial phase mismatch a, the second signal CKB remains 1 throughout the rise of the first signal CKT, and even after the first signal CKT changes to 1, the second signal CKB still remains 1 for a period of time. However, before the first signal CKT rises by more than ½, an NMOS transistor 312 of the first inverter module 310 is turned off. Therefore, although the second signal CKB is 1, the second signal CKB cannot advance the first clock output signal CKB_D through an NMOS transistor 372 of the second feedforward buffer 370, and the start point of the falling edge of the first clock output signal CKB_D starts when the first signal CKT rises by more than ½ to turn on the NMOS transistor 312 of the first inverter module 310. Second, after the NMOS transistor 312 of the first inverter module 310 is turned on to form a loop with the NMOS transistor 372 of the second feedforward buffer 370, the end point of the falling edge of the first clock output signal CKB_D does not arrive until the second signal CKB changes from 1 to ½.

As can be learned from FIG. 4, in the falling process of the second signal CKB, the first signal CKT always remains 1. In this case, the first signal CKT turns on an NMOS transistor 352 of the first feedforward buffer 350. The turned-on NMOS transistor 352 of the first feedforward buffer 350 forms a loop with an NMOS transistor 332 of the second inverter module 330, and a voltage VDD output from the NMOS transistor 352 of the first feedforward buffer 350 affects a process in which the signal CKT_D output from the second inverter module 330 gradually changes from 0 to 1. Since VDD is usually 1, due to the presence of the initial phase mismatch a, the first signal CKT compensates for, through the NMOS transistor 352 of the first feedforward buffer 350, the process in which the second clock output signal CKT_D gradually changes from 0 to 1. In this way, the arrival of the start point of the rising edge of the second clock output signal CKT_D is advanced.

The time difference between the first clock output signal CKB_D and the second clock output signal CKT_D is compensated by delaying the arrival of the end point of the falling edge of the first clock output signal CKB_D and advancing the arrival of the start point of the rising edge of the second clock output signal CKT_D, such that the phase mismatch after calibration is related only to the rise time β of the first signal CKT and is no longer affected by the phase difference between the initial signals and the frequency.

Figure 5:
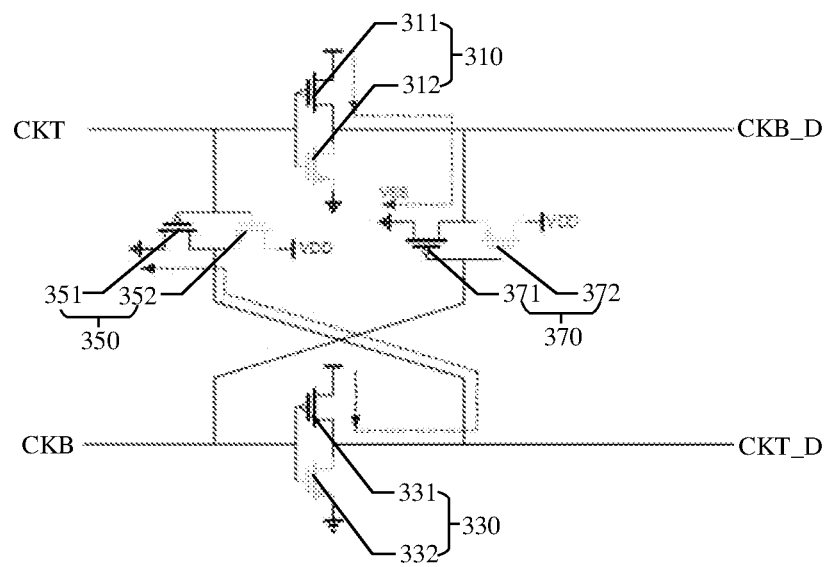
FIG. 5 schematically illustrates a schematic structural diagram of another dual-clock generation circuit of phase mismatch calibration according to an exemplary implementation of the present disclosure.
Figure 6:
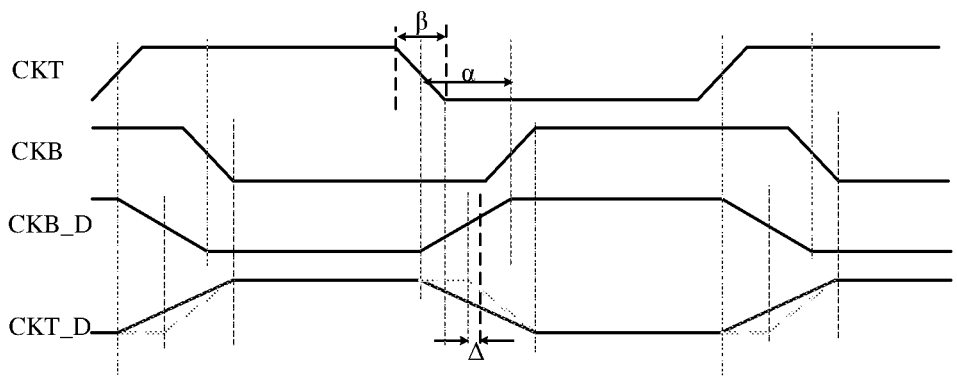
FIG. 6 schematically illustrates a schematic diagram of signal waveforms corresponding to the dual-clock generation circuit shown in FIG. 5.

FIG. 5 and FIG. 6 respectively show a circuit diagram for improving the falling edge of the input signal CKT, that is, the first signal, and a waveform diagram thereof.

In FIG. 5, the first feedforward buffer 350 and the second feedforward buffer 370 each are also a CMOS transistor including an NMOS transistor and a PMOS transistor, that is, each are a MOS transistor including an N-type MOS transistor and a P-type MOS transistor. In the process of improving the falling edge of the input first signal CKT, as can be learned from FIG. 5, due to the presence of the initial phase mismatch a, the second signal CKB remains 0 throughout the falling of the first signal CKT, and even after the first signal CKT changes to 0, the second signal CKB still remains 0 for a period of time. However, before the first signal CKT falls by more than ½, a PMOS transistor 311 of the first inverter module 310 is turned off. Therefore, although the second signal CKB is 0, the second signal CKB cannot advance the first clock output signal CKB_D through a PMOS transistor 371 of the second feedforward buffer 370, and the start point of the rising edge of the first clock output signal CKB_D starts when the first signal CKT falls by more than ½ to turn on the PMOS transistor 311 of the first inverter module 310. Second, after the PMOS transistor 311 of the first inverter module 310 is turned on to form a loop with the PMOS transistor 371 of the second feedforward buffer 370, the end point of the rising edge of the first clock output signal CKB_D does not arrive until the second signal CKB changes from 0 to ½.

Meanwhile, the falling process of the first signal CKT is also the rising process of the second signal CKB. As can be learned from FIG. 6, in the rising process of the second signal CKB, the first signal CKT always remains 0. In this case, the first signal CKT turns on a PMOS transistor 351 of the first feedforward buffer 350. The turned-on PMOS transistor 351 of the first feedforward buffer 350 forms a loop with a PMOS transistor 331 of the second inverter module 330, and a signal 0 output from the PMOS transistor 351 of the first feedforward buffer 350 affects a process in which the second clock output signal CKT_D gradually changes from 1 to 0. Due to the presence of the initial phase mismatch a, the first signal CKT compensates for, through the PMOS transistor 351 of the first feedforward buffer 350, the process in which the second clock output signal CKT_D gradually changes from 1 to 0. In this way, the arrival of the start point of the falling edge of the second clock output signal CKT_D is advanced.

The time difference between the first clock output signal CKB_D and CKT_D is compensated by delaying the arrival of the end point of the rising edge of the first clock output signal CKB_D and advancing the arrival of the start point of the falling edge of the second clock output signal CKT_D, such that the phase mismatch after calibration is related only to the fall time β of the first signal CKT and is no longer affected by the phase difference between the initial signals and the frequency.

As can be learned from FIG. 3 and FIG. 5, the first feedforward buffer 350 and the second feedforward buffer 370 in both figures include CMOS transistors. In other words, the first feedforward buffer 350 and the second feedforward buffer 370 including CMOS transistors not only can improve the rising edge of the first signal CKT, but also can improve the falling edge of the first signal CKT.

Figure 7:
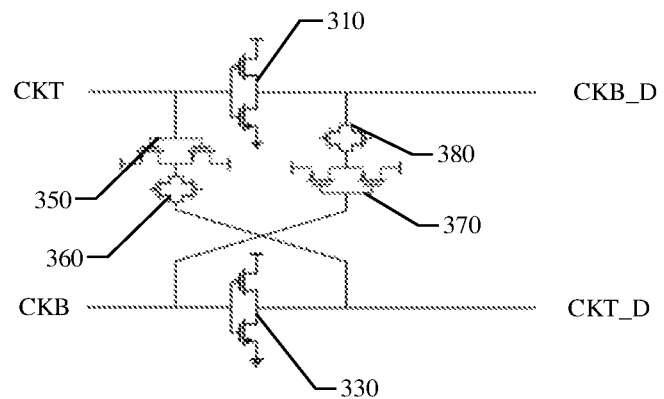
FIG. 7 schematically illustrates a schematic structural diagram of another dual-clock generation circuit of phase mismatch calibration according to an exemplary implementation of the present disclosure.
Figure 8:
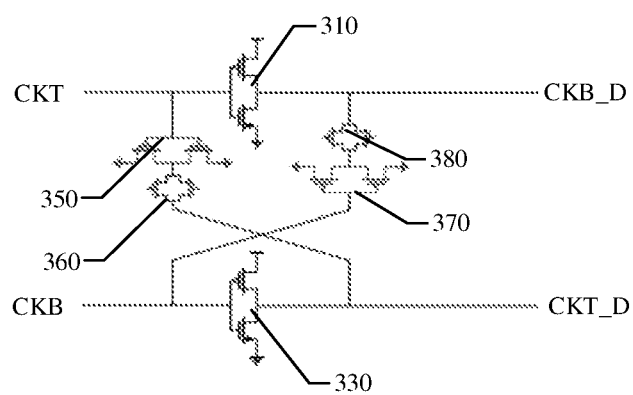
FIG. 8 schematically illustrates a schematic structural diagram of another dual-clock generation circuit of phase mismatch calibration according to an exemplary implementation of the present disclosure.

In addition, FIG. 7 and FIG. 8 show two other manners of combining the first feedforward buffer 350 and the second feedforward buffer 370: In FIG. 7, the first feedforward buffer 350 and the second feedforward buffer 370 each are an NMOS transistor including two NMOS transistors. In FIG. 8, the first feedforward buffer 350 and the second feedforward buffer 370 each are a PMOS transistor including two PMOS transistors.

As can be learned from the analysis of the foregoing working principles of FIG. 3 and FIG. 5, the first feedforward buffer 350 and the second feedforward buffer 370 in FIG. 7 are mainly configured to improve the rising edge of the first signal; and the first feedforward buffer 350 and the second feedforward buffer 370 in FIG. 8 are mainly configured to improve the falling edge of the first signal. For the working principle of the dual-clock generation circuit shown in FIG. 7, reference may be made to the working principle of FIG. 3 for analysis. For the working principle of the dual-clock generation circuit shown in FIG. 8, reference may be made to the working principle of FIG. 5 for analysis. The working principle of the dual-clock generation circuit shown in each of FIG. 7 and FIG. 8 is not described in detail herein again.

In an exemplary implementation of the present disclosure, the first inverter module 310 may include a first inverter, and the second inverter module 330 may include a second inverter. In FIG. 3, FIG. 5, FIG. 7, and FIG. 8, the first inverter and the second inverter each are a CMOS transistor including An NMOS transistor and a PMOS transistor. During actual application, the first inverter and the second inverter may alternatively be other types of inverters. This is not specially limited in this exemplary implementation of the present disclosure.

Figure 9:
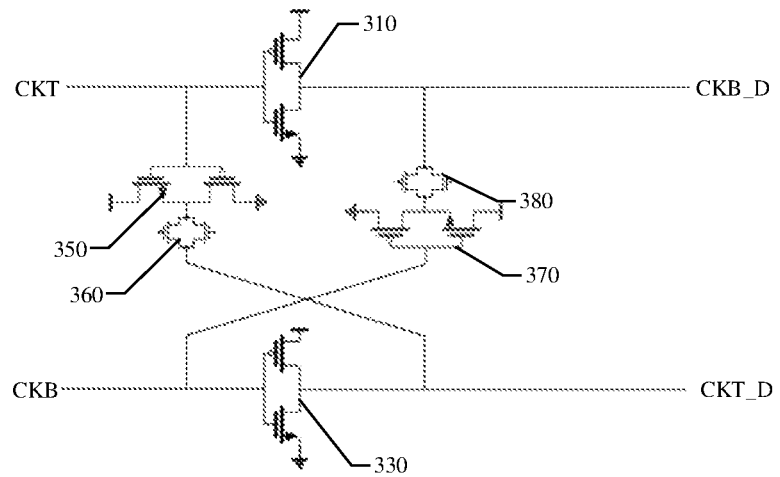
FIG. 9 schematically illustrates a schematic structural diagram of another dual-clock generation circuit of phase mismatch calibration according to an exemplary implementation of the present disclosure.

Referring to FIG. 7 to FIG. 9, the dual-clock generation circuit provided in this exemplary implementation of the present disclosure further includes a first switch 360 and a second switch 380. The first switch 360 is disposed on a line of the first feedforward buffer 350, and configured to control on/off of the first feedforward buffer 350. The second switch 380 is disposed on a line of the second feedforward buffer 370, and configured to control on/off of the second feedforward buffer 370. Therefore, on/off of the first feedforward buffer 350 and the second feedforward buffer 370 may be flexibly controlled as needed. For example, the first feedforward buffer 350 and the second feedforward buffer 370 may be controlled to be turned on at the same time, or only the first feedforward buffer 350 may be controlled to be turned on, or only the second feedforward buffer 370 may be controlled to be turned on, or both the first feedforward buffer 350 and the second feedforward buffer 370 may be turned off as needed. This is not specially limited in this exemplary implementation of the present disclosure.

In this exemplary implementation of the present disclosure, the disposed first switch 360 and second switch 380 each may be connected to a frequency control signal, to control, when a sampling frequency of the input signal is a high frequency, the first feedforward buffer 350 and the second feedforward buffer 370 to be turned on, such that phase mismatch calibration can be performed on the input clock signal only at a high frequency, and control the first feedforward buffer 350 and the second feedforward buffer 370 to be turned off at a low frequency, thereby achieving current saving. In addition, phase mismatch is usually more serious at a high frequency. Therefore, the first feedforward buffer 350 and the second feedforward buffer 370 are turned on only at the high frequency, which has a small impact on precision of the phase mismatch calibration.

For example, a first frequency control signal may be connected to the first switch 360, for controlling, when a sampling frequency of the first signal is a high frequency, the first feedforward buffer 350 to be turned on. A second frequency control signal is connected to the second switch 380, for controlling, when a sampling frequency of the second signal is a high frequency, the second feedforward buffer 370 to be turned on. Because the first signal and the second signal are two opposite signals having a phase difference of 180 degrees, the sampling frequencies of the first signal and the second signal are the same. Therefore, alternatively, a same frequency control signal may be connected to the first switch 360 and the second switch 380. For example, a same first frequency control signal or a same second frequency control signal may be connected to the first switch 360 and the second switch 380.

During actual application, the frequency control signal is a signal that is output when the sampling frequency of the first signal or the second signal is greater than a preset sampling rate, to turn on the first switch 360 and the second switch 380. For example, when the first switch 360 and the second switch 380 each are a CMOS analog switch, the first frequency control signal and the second frequency control signal are each a signal for outputting a high level 1 when the sampling frequency is greater than the preset sampling rate, such that the first switch 360 and the second switch 380 can be turned on.

During actual application, the preset sampling rate may be set according to an actual situation. For example, the preset sampling rate may be 2,666 MHz or 3,200 MHz. The preset sampling rate is not specially limited in this exemplary implementation of the present disclosure.

During actual application, the first switch 360 and the second switch 380 not only can be turned on when the frequency control signal is at a high frequency, but also can be turned on in other control manners set according to actual needs. For example, the first switch 360 or the second switch 380 may be turned on when the frequency control signal is at a low frequency, or may always remain in a turned-on state without any frequency control signal. Any other turn-on manner is applicable, which is not specially limited in this exemplary implementation of the present disclosure.

The dual-clock generation circuit provided in this exemplary implementation of the present disclosure is applicable not only to a clock signal but also to the phase mismatch calibration of any two opposite signals having a phase difference of 180 degrees.

Figure 10:
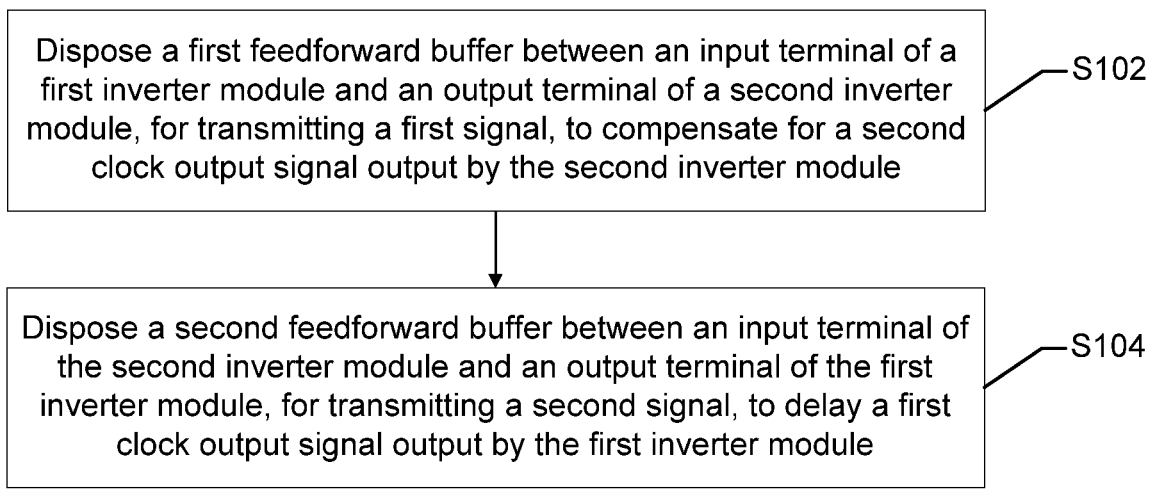
FIG. 10 schematically illustrates a flowchart of a method of generating a dual-clock according to an exemplary implementation of the present disclosure.

An exemplary implementation of the present disclosure further provides a method of generating a dual-clock, applied to the dual-clock generation circuit described above, and the dual-clock generation circuit includes a first inverter module configured to access a first signal, a second inverter module configured to access a second signal, a first feedforward buffer, and a second feedforward buffer. Referring to FIG. 10, the method of generating a dual-clock may specifically include:

Step S102. Dispose the first feedforward buffer between an input terminal of the first inverter module and an output terminal of the second inverter module, for transmitting the first signal, to compensate for a second clock output signal output by the second inverter module.

Step S104. Dispose the second feedforward buffer between an input terminal of the second inverter module and an output terminal of the first inverter module, for transmitting the second signal, to delay a first clock output signal output by the first inverter module.

In some embodiments of the present disclosure, the method further includes: disposing a first switch on a line of the first feedforward buffer, for controlling on/off of the first feedforward buffer; and disposing a second switch on a line of the second feedforward buffer, for controlling on/off of the second feedforward buffer.

In some embodiments of the present disclosure, the method further includes: connecting a frequency control signal to each of the first switch and the second switch, for controlling the first switch and the second switch to be turned on or off under control of the frequency control signal.

In some embodiments of the present disclosure, the method further includes: when the frequency control signal is at a high frequency, controlling the first switch and the second switch to be turned on.

In some embodiments of the present disclosure, the method further includes: setting the first feedforward buffer and the second feedforward buffer to including two same or different MOS transistors, to perform phase calibration on a rising edge of the first signal and/or a falling edge of the first signal.

The foregoing two different MOS transistors refer to the case of CMOS transistors including two different MOS transistors, namely, PMOS transistors and NMOS transistors, shown in FIG. 3 and FIG. 5. The two same MOS transistors refer to the case of same NMOS transistors shown in FIG. 7, or the case of same PMOS transistors shown in FIG. 8.

In the method of generating a dual-clock provided in this exemplary implementation of the present disclosure, the first feedforward buffer is disposed between the input terminal of the first inverter module and the output terminal of the second inverter module, such that the first signal can be transmitted to the output terminal of the second inverter module through the first feedforward buffer, to use the first signal to compensate for the second clock output signal output by the second inverter module, to advance the second clock output signal. In addition, the second feedforward buffer is disposed between the input terminal of the second inverter module and the output terminal of the first inverter module, such that the second signal can be transmitted to the output terminal of the first inverter module through the second feedforward buffer, to use the second signal to delay the first clock output signal output by the first inverter module, to postpone an end point of the first clock output signal. The end point of the first clock output signal is postponed and a start point of the second clock output signal is advanced, such that a phase difference between the two output signals can be reduced, thereby reducing phase mismatch between generated dual-clock signals.

The specific details of the steps in the foregoing method of generating a dual-clock have been described in the corresponding dual-clock generation circuit. Therefore, the details are not described herein again.

An exemplary implementation of the present disclosure further provides an electronic device. The electronic device may include the dual-clock generation circuit described above. The specific structural form and working principle of the dual-clock generation circuit have been described in detail in the foregoing embodiments, and details are not described herein again.

All or some of the foregoing embodiments may be implemented by means of software, hardware, firmware, or any combination thereof. When a software program is used to implement the embodiments, the embodiments may be implemented completely or partially in a form of a computer program product. The computer program product includes one or more computer instructions. When the computer program instructions are loaded and executed on a computer, the procedure or functions according to the embodiments of the present disclosure are all or partially generated. The computer may be a general-purpose computer, a dedicated computer, a computer network, or other programmable apparatuses. The computer instructions may be stored in a computer readable storage medium, or transmitted from one computer readable storage medium to another computer readable storage medium. The computer-readable storage medium may be any usable medium accessible by a computer, or a data storage device, such as a server or a data center, integrating one or more usable media. The usable medium may be a magnetic medium (such as a floppy disk, a hard disk, or a magnetic tape), an optical medium (such as a DVD), or a semiconductor medium (such as a solid state disk (SSD)). In the embodiments of the present disclosure, the computer may include the apparatuses described above.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the dual-clock generation circuit provided in the present disclosure, the end point of the first clock output signal is postponed and the second clock output signal is advanced, such that the phase difference between the two output signals can be reduced, thereby reducing phase mismatch between generated dual-clock signals.

The invention claimed is:

1. A dual-clock generation circuit, wherein the dual-clock generation circuit comprises:
   a first inverter module, configured to access a first signal and output a first clock output signal;
   a second inverter module, configured to access a second signal and output a second clock output signal, wherein the first signal and the second signal are opposite clock signals;
   a first feedforward buffer, disposed between an input terminal of the first inverter module and an output terminal of the second inverter module, and configured to transmit the first signal to compensate for the second clock output signal;
   a second feedforward buffer, disposed between an input terminal of the second inverter module and an output terminal of the first inverter module, and configured to transmit the second signal to delay the first clock output signal;
   a first switch, disposed on a line of the first feedforward buffer, and configured to control on/off of the first feedforward buffer; and
   a second switch, disposed on a line of the second feedforward buffer, and configured to control on/off of the second feedforward buffer;
   wherein the first switch and the second switch respectively access a frequency control signal, to be turned on or off under control of the frequency control signal; and
   wherein the first switch is configured to be turned on in response to a sampling frequency of the first signal being greater than a preset sampling rate, and the second switch is configured to be turned on in response to a sampling frequency of the second signal being greater than the preset sampling rate.

2. The circuit according to claim 1, wherein the first switch and the second switch each are a complementary metal-oxide-semiconductor (CMOS) analog switch.

3. The circuit according to claim 1, wherein the first feedforward buffer and the second feedforward buffer each are a complementary metal-oxide-semiconductor (CMOS) transistor comprising an N-type metal-oxide-semiconductor (NMOS) transistor and a P-type metal-oxide-semiconductor (PMOS) transistor.

4. The circuit according to claim 1, wherein the first feedforward buffer and the second feedforward buffer each are an N-type metal-oxide-semiconductor (NMOS) transistor comprising two NMOS transistors.

5. The circuit according to claim 1, wherein the first feedforward buffer and the second feedforward buffer each are a P-type metal-oxide-semiconductor (PMOS) transistor comprising two PMOS transistors.

6. The circuit according to claim 1, wherein the first inverter module comprises a first inverter, and the second inverter module comprises a second inverter.

7. The circuit according to claim 6, wherein the first inverter and the second inverter each are a complementary metal-oxide-semiconductor (CMOS) transistor comprising an N-type metal-oxide-semiconductor (NMOS) transistor and a P-type metal-oxide-semiconductor (PMOS) transistor.

8. An electronic device, wherein the electronic device comprises the dual-clock generation circuit according to claim 1.

9. A method of generating a dual-clock, wherein the method is applied to a dual-clock generation circuit, the dual-clock generation circuit comprises a first inverter module configured to access a first signal, a second inverter module configured to access a second signal, a first feedforward buffer, and a second feedforward buffer, and the method comprises:
   disposing the first feedforward buffer between an input terminal of the first inverter module and an output terminal of the second inverter module, for transmitting the first signal, to compensate for a second clock output signal output by the second inverter module;
   disposing the second feedforward buffer between an input terminal of the second inverter module and an output terminal of the first inverter module, for transmitting the second signal, to delay a first clock output signal output by the first inverter module;
   disposing a first switch on a line of the first feedforward buffer, for controlling on/off of the first feedforward buffer;
   disposing a second switch on a line of the second feedforward buffer, for controlling on/off of the second feedforward buffer; and
   connecting a frequency control signal to each of the first switch and the second switch, for controlling the first switch and the second switch to be turned on or off under control of the frequency control signal;
   wherein the first switch is configured to be turned on in response to a sampling frequency of the first signal being greater than a preset sampling rate, and the second switch is configured to be turned on in response to a sampling frequency of the second signal being greater than the preset sampling rate.

10. The method according to claim 9, wherein the method further comprises:

setting the first feedforward buffer and the second feedforward buffer to be same or different metal-oxide-semiconductor (MOS) transistors, to perform phase calibration on at least one of a rising edge of the first signal or a falling edge of the first signal.

* * * * *